United States Patent
Kucukcakar et al.

(10) Patent No.: US 6,964,027 B2
(45) Date of Patent: Nov. 8, 2005

(54) SYSTEM AND METHOD FOR OPTIMIZING EXCEPTIONS

(75) Inventors: Kayhan Kucukcakar, Sunnyvale, CA (US); Rachid N. Helaihel, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 163 days.

(21) Appl. No.: 10/417,926

(22) Filed: Apr. 16, 2003

(65) Prior Publication Data

US 2004/0210861 A1 Oct. 21, 2004

(51) Int. Cl.$^7$ .............................................. G06F 17/50
(52) U.S. Cl. .................... 716/2; 716/5; 716/6
(58) Field of Search ..................... 716/2, 4–6, 8–14

(56) References Cited

U.S. PATENT DOCUMENTS 6,496,972 B1 * 12/2002 Segal ........................ 716/18
6,678,644 B1 *  1/2004 Segal ........................ 703/15

* cited by examiner

*Primary Examiner*—Vuthe Siek
(74) *Attorney, Agent, or Firm*—Park, Vaughan & Fleming, LLP

(57) ABSTRACT

A method and system of optimizing exceptions to default timing constraints for use in integrated circuit design tools is described. A list of exceptions is accessed and optimized to generate a new list of exceptions. Optimizations may include: elimination of redundant information, resolution of conflicting information, and other transformations. The new list allows more efficient timing analysis, synthesis, placement, routing, noise analysis, power analysis, reliability analysis, and other operations to be performed by EDA tools.

18 Claims, 4 Drawing Sheets

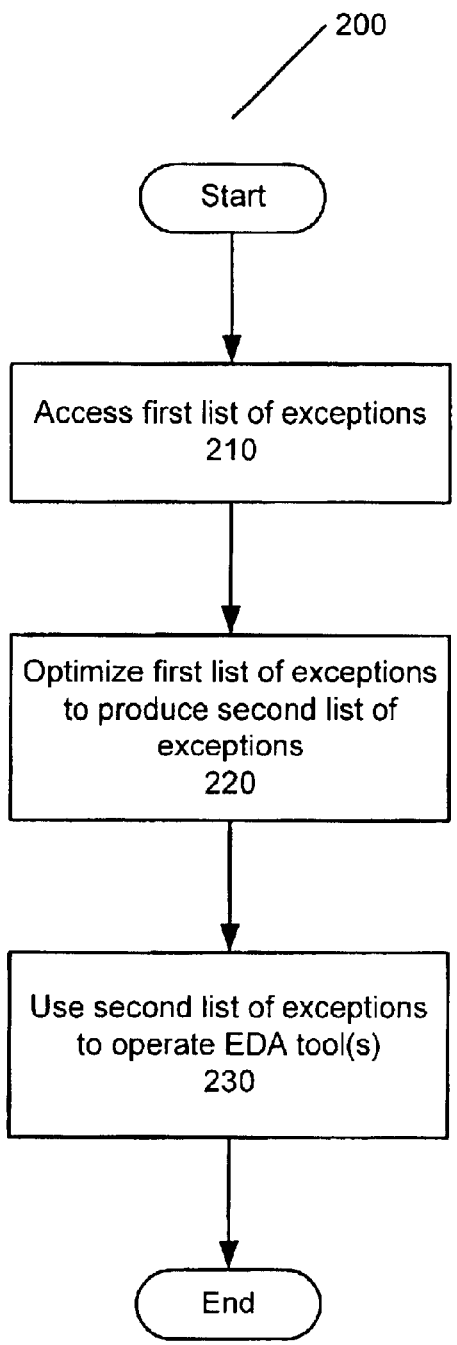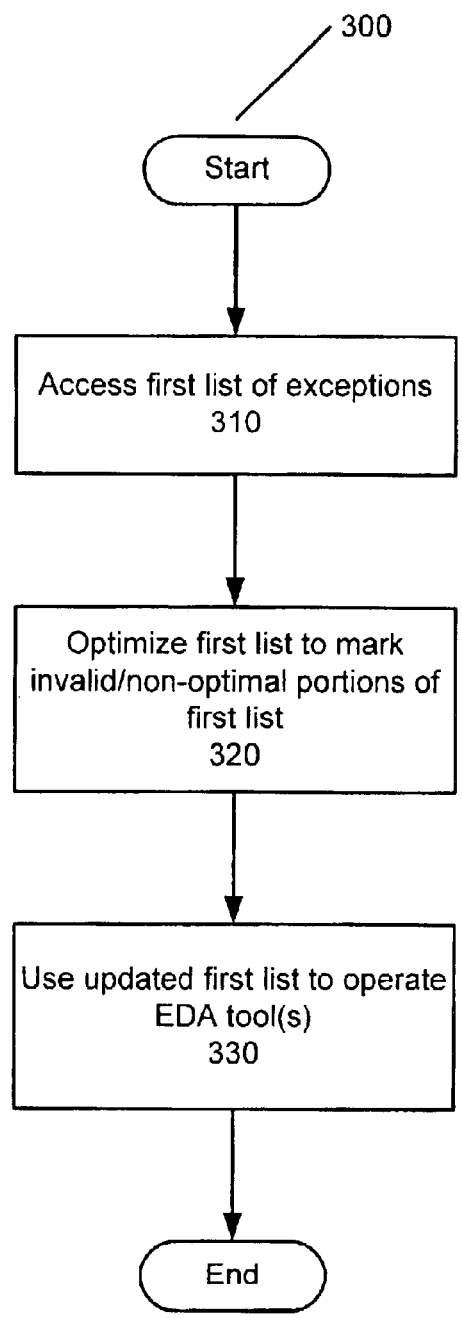
Figure 2
Figure 3

SYSTEM AND METHOD FOR OPTIMIZING EXCEPTIONS

FIELD OF THE INVENTION

Embodiments of the present invention relate to the field of electronic design automation (EDA). More particularly, embodiments of the present invention relate to computer implemented processes of analyzing various aspects of electronic circuits.

BACKGROUND ART

The rapid growth of the complexity of modern electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually.

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. A netlist describes an IC design and is composed of nodes (elements) and edges, e.g., connections between nodes, and can be represented using a directed cyclic graph structure having nodes which are connected to each other with signal lines. At a higher level of abstraction, a generic netlist is typically produced based on technology independent primitives. The generic netlist can be translated into a lower level technology-specific netlist based on a technology-specific library that has gate-specific models for timing and power estimation. A single node can have multiple inputs and can output a signal or signals to multiple other nodes. The netlist is typically stored in computer readable media within the EDA system and processed and verified using many well-known techniques.

The design flow for the design of integrated circuits (e.g., ASIC, microprocessors, microcontrollers, etc.) requires several descriptions of the design library that are used as input to different CAD tools. For instance, a synthesis library is typically required. The main loop in the IC design environment consists of describing the IC design in terms of primitive models from the synthesis library, verifying (e.g., functionality, power and timing constraints, etc.) through various verification techniques and then refining and correcting the IC design. During this process, timing and power estimations or analyses are often performed by the computer system to optimize the IC design and to determine if the overall circuit design is maintaining prescribed timing and power constraints.

In the conventional art, a list of exceptions is typically an input to an EDA tool, for example a timing analysis tool. The exceptions are non-default constraints, e.g., timing constraints that delineate exceptional circumstances that are generally not addressed by the default behavior of the EDA tool. For example, conventional EDA timing analysis tools can not determine if a synchronous path is intended to function in one clock cycle (a typical default for the EDA tool) or if that path is designed to function in multiple clock cycles. Typically an exception specifies such a multi-cycle path. There are numerous other reasons for, and types of, exceptions. These are generally well known by those of ordinary skill in the EDA arts. A widely used design constraints format, known as Synopsys Design Constraints (SDC), commercially available from Synopsys, Inc. of Mountain View, Calif., describes the "design intent" and surrounding constraints for synthesis, clocking, timing, power, test, environmental and operating conditions and the like for various EDA tools from multiple vendors.

FIG. 1 illustrates an exemplary portion 100 of an integrated circuit design. Symbols A 110, C 112 and D 114 designate input terminals to circuit portion 100. Symbols E 116 and F 118 designate output terminals of circuit portion 100. Logic bates 101, 111, 120, 130 and 140 are also denoted by "u" or "module" numbers as is conventional in the electronic arts. For example, u0, u1, u2, u3 and u4 correspond to drawing designators 101, 111, 120, 130 and 140 respectively. Several nodes within circuit portion 100 are further identified. Inputs to u3 130 are designated u3/i0 132 and u3/i1 134. Similarly, the output of U2 120 is designated u2/o. The input to U4 140 is designated u4/i 142.

An exemplary exception may be applied to circuit portion 100 as follows:

set_false_path-from A-to F

This exception instructs an EDA tool, e.g., a timing analysis tool, to ignore timing characteristics from A 110 to F 118.

Modern integrated circuit designs may comprise hundreds of thousands to millions of gates. The number of interconnections between such gates may be an order of magnitude greater than the number of gates. The number of signal paths among such gates, e.g., from a first input through a number of gated to an output, may be several orders of magnitude higher still. Typically, the vast majority of such permutations of possible signal paths are not part of a desired signal flow of the circuit. As an unfortunate consequence of the tremendous numbers of such paths, it is impractical for human designers to study each possible signal path and manually specify an exception if necessary.

Numerous tools and techniques have been employed to facilitate the generation of exceptions. Among such techniques are the wide use of "wildcards" to specify entire sets of nodes, e.g., u3/i* to specify all inputs to u3, the use of historical exception lists from predecessor designs, automated scripts and automatic exception generators. For example, it is not uncommon to generate one million exceptions by such means. Unfortunately, due to mistakes, oversights, tool defects and the like, typically many exceptions which are specified are invalid or specified in a non-optimal form. Conventional EDA tools suffer, for example, increased execution time and increased memory requirements as a result of analyzing such non-optimal exceptions.

Further, as circuit designers become more detached from the generation of exceptions, outputs from EDA tools, e.g., a timing analysis tool, become more difficult to understand and interpret. For example, it may be difficult to determine that a critical path was erroneously listed as an exception, and consequently no analysis was performed on that path. Therefore, a method for optimizing exceptions is much needed and highly desirable.

SUMMARY OF THE INVENTION

Embodiments of the present invention optimize a set of exceptions to default timing constraints for use in integrated circuit design tools. Further embodiments of the present invention utilize an optimized list of exceptions to perform well-known processes in the design of very large scale integrated circuits. Still further embodiments of the present invention enable a user of exceptions to better understand the effect of a list of exceptions on the operation of various design tools.

A method and system of optimizing exceptions to default timing constraints for use in integrated circuit design tools are disclosed. A first list of exceptions is accessed. That list is optimized and a new list of exceptions is generated. Optimizations performed may include elimination of redundant information, resolution of conflicting information and other transformations. The new list of exceptions allows electronic design automation tools to perform their functions more efficiently. The new list may be used by electronic design automation tools to perform timing analysis, synthesis, placement, routing, noise analysis, power analysis, reliability analysis and other operations well known in the design of very large scale integrated circuits.

BRIEF DESCRIPTION OF THE DRAWINGS

FIG. 2 illustrates a method 200 of optimizing a list of exceptions, according to an embodiment of the present invention.

FIG. 3 illustrates a method 300 of marking invalid/non-optimal portions of a list of exceptions for use in a subsequent analysis.

DETAILED DESCRIPTION OF THE INVENTION

Figure 1:
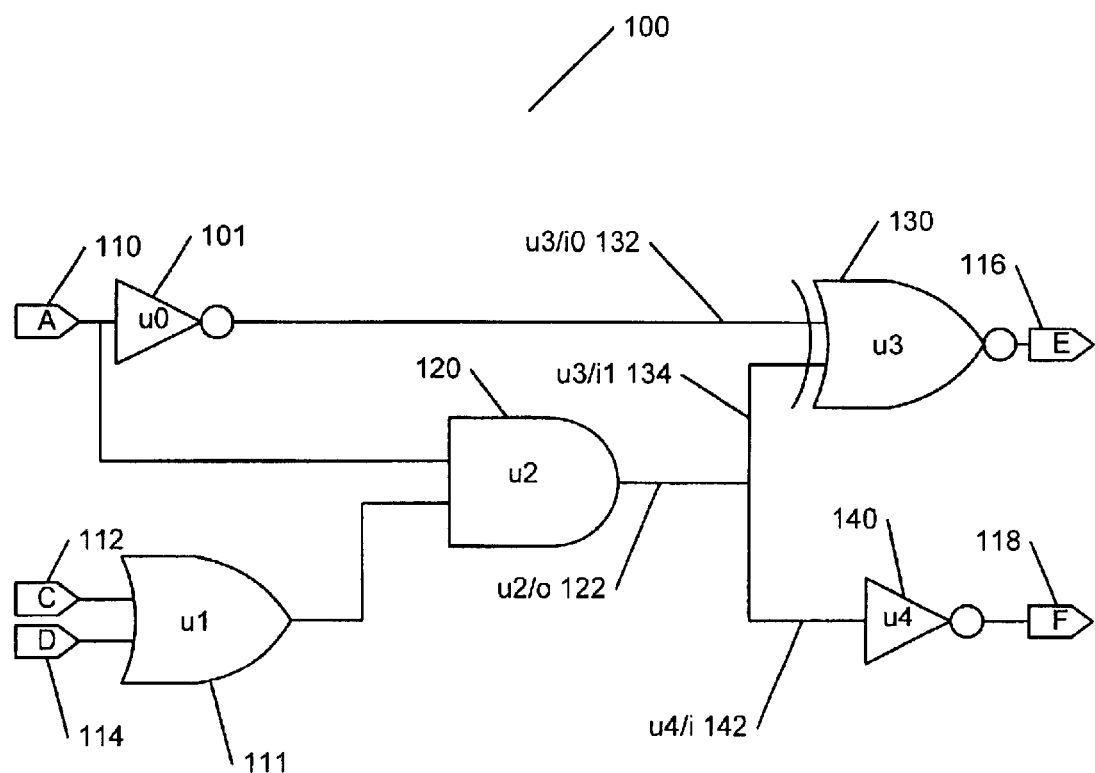
FIG. 1 illustrates an exemplary portion of an integrated circuit design 100.

In the following detailed description of the present invention, system and method for optimizing exceptions, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed description that follows (e.g., processes 200, 300, and 400) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "selecting" "moving" or "repeating" or "combining" or "testing" or "setting" or "increasing" or "transforming" or "determining" or "optimizing" or "synthesizing" or "grouping" or "estimating" or "describing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention are described in the context of the field of electronic design automation (EDA). More particularly, embodiments of the present invention relate to techniques for optimizations used in the design and fabrication of integrated circuit devices. It is appreciated, however, that elements of the present invention may be utilized in other areas of EDA.

The functional design of an electronic integrated circuit specifies the cells (individual functional elements) that compose the circuit and which pins of which cells are to be coupled together using wires or "nets." Typically, much or all of the design of an integrated circuit is specified in a high level language, for example "HDL." Though a process of computer implemented synthesis, or "synthesizing" high level constructs are converted into cells and nets.

U.S. Pat. No. 6,237,127, entitled "Static timing analysis of digital electronic circuits using non-default constraints known as exceptions," to T. Craven et al., issued May 22, 2001 and assigned to the assignee of the present application, is hereby incorporated herein by reference in its entirety.

FIG. 2 illustrates a method 200 of optimizing a list of exceptions, according to an embodiment of the present invention. In step 210, a first list of exceptions is accessed. The exceptions define certain paths (or nodes) through a circuit design as being subject to non-default timing constraints.

In step 220, the first list of exceptions is optimized to generate a second list of exceptions. The second list of exceptions enables electronic design automation tools, e.g., timing analysis, synthesis, placement, routing, noise analysis, power analysis, reliability analysis tools and the like to operate more efficiently on the circuit design using the second list of exceptions versus the first list of exceptions.

According to embodiments of the present invention, efficiency in using the second list of exceptions versus the first list of exceptions may be determined for a number of metrics. For example, an EDA tool may operate faster, e.g., require less time to complete, using the second list of exceptions versus the first list of exceptions. Speed of operation is a critical factor for EDA tools, especially with modern, large integrated circuit designs. For example, to perform a timing analysis on a conventional integrated circuit design of a few million gates may require a run time of a few days. A complete design cycle for a chip may require several iterations of this, and other, EDA tools.

Consequently, run time is a critical performance metric of an EDA tool, and speed of operation is highly competitive among EDA tool vendors.

According to another embodiment of the present invention, an EDA tool may utilize memory more efficiently using the second list of exceptions versus the first list of exceptions. For example, an EDA tool may use less memory to execute using the second list of exceptions versus the first list of exceptions. Memory, especially real memory (as opposed to virtual memory) is a critical resource in an EDA system, with a strong influence on speed of execution. In general, the more memory, the faster the EDA tool runs. Typically, the memory requirements of a large integrated circuit design exceed the real memory capacity of an EDA system, and a great deal of time is spent swapping virtual memory to and from a storage system. Increases in memory efficiency may allow more of a design to be resident in real memory, increasing performance. Increases in memory efficiency may also allow faster transfers across communication links, e.g., storage area networks and the internet, and may better accommodate various transportable and archival storage media. It should also be noted that some computers have a limited, or fixed, address space and as such the application may not be capable of running if more than that amount of memory would be required.

According to another embodiment of the present invention as shown in optional step 230, the second list of exceptions may be used by various well known electronic design automation tools, including without limitation timing analysis tools, synthesis tools, placement tools, routing tools, noise analysis tools, power analysis tools and reliability analysis tools.

FIG. 3 illustrates a method 300 of marking invalid/non-optimal portions of a list of exceptions for use in a subsequent analysis through optimization. The steps are analogous to the steps used in method 200. Here at step 310, the first list of exceptions is accessed. Next, at step 320, exceptions on the list are marked if they are invalid, overridden, redundant, non-optimal, etc. Finally, at step 330, the first set of exceptions as optimized by ignoring marked exceptions are used for analysis.

Figure 4:
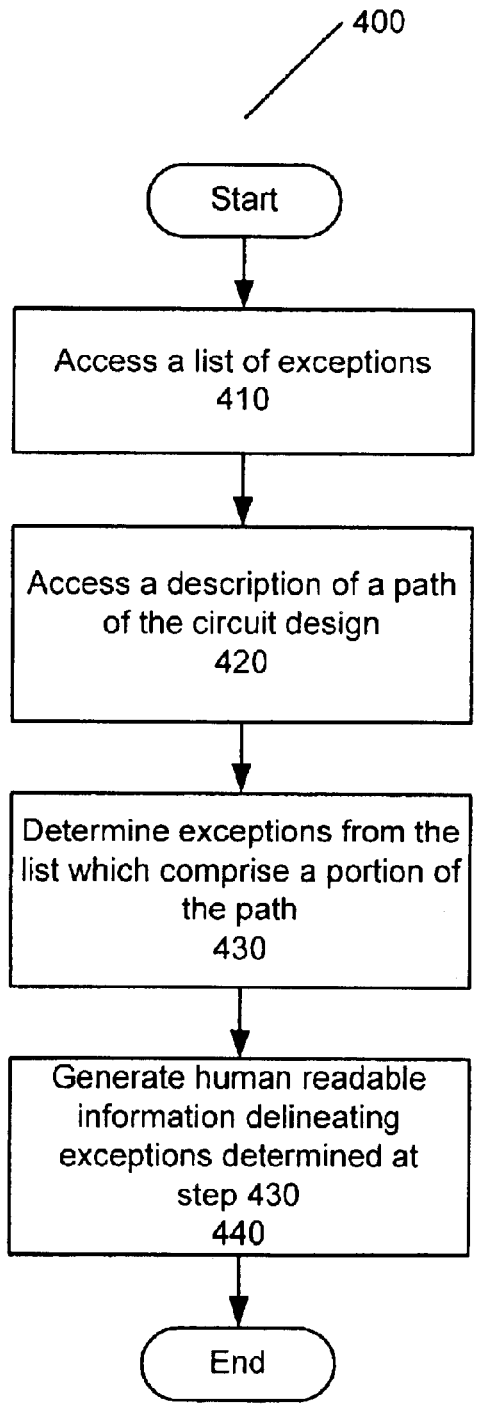
FIG. 4 illustrates a method 400 of analyzing a list of exceptions defining non-default timing constraints of a circuit design, according to an embodiment of the present invention.

FIG. 4 illustrates a method 400 of analyzing a list of exceptions defining non-default timing constraints of a circuit design, according to an embodiment of the present invention. It is to be appreciated that the list of exceptions may be, but is not necessarily the first list of exceptions or the second list of exceptions referred to previously.

In step 410, a list of exceptions defining non-default timing constraints of a circuit design is accessed.

In step 420, a description of a path of the circuit design is accessed. The path is typically described in a format similar to that of exceptions.

In step 430, exceptions of the list of exceptions which comprise a portion of the path are determined. For example, the deemed path should include an initial node or terminal. Embodiments of the present invention will determine exceptions of the list of exceptions which comprise that node or terminal.

Referring once again to FIG. 1, a list of exemplary exceptions may be delineated as follows:
set_false_path-from A-to F
set_false_path-from C-to E
These exception statements identify signal paths, from A 110 to F 118 and from C 112 to E 116 respectively, that are not to be operated on by an EDA tool, e.g., a timing analysis tool. An exemplary set of exception-like command statements may be:

transform exceptions-through u2/o-through u3/i1-dry_run-verbose
indicating that a user desires information on the timing analysis of design signal/circuit paths traversing u2/o 122 to u3/i1 134. Embodiments of the present invention can determine that this path was ignored in some of the analysis due to the "set_false$_{13}$path-from C-to E" exception.

In optional step 440, human readable information delineating exceptions based on the list of exceptions which comprise a portion of the path is generated. For example, a statement that the path "-through u2/o-through u3/i1" was ignored in some of the analysis due to the "set_false_path-from C-to E" exception may be displayed for a user to view.

According to still another embodiment of the present invention, a region, e.g., the "upper left quadrant" of an integrated circuit design may be specified. Signal path(s) within such a region may be identified and exceptions of the list of exceptions which comprise a portion of such path(s) are determined.

Analysis and optimization are capable of operating on a user-specified subset of a design. The specifiers used are the same as ones for exceptions, e.g., from-through-to (rise/fall). It is to be appreciated that the same analysis can be performed and the same optimization checks can be performed relative to all specifier objects.

Embodiments of the present invention may be useful to designers in a wide range of design activities, e.g., from constraint validation to timing violation debugging. By employing embodiments of the present invention, an integrated circuit designer is able to verify that an exception is satisfied as intended on specified paths and understand the interaction between entered exceptions. Under the conventional art, these tasks are complex and error prone, especially when exceptions are established by different design groups working on separate submodules.

It is to be appreciated that an exception may specify a timing requirement that is faster than a default condition. For example, all design paths originating from a rise transition at an input node may be specified by an exception statement to be faster than the default rise time. Continuing with the example, assume that a default required time is 2 ns and that an exception statement requires the path delays originating from a transition at a particular input node to be less than 1 ns.

When an EDA tool, e.g., a timing analysis tool, operates on a path including the input node, the timing may be found to be in violation of the exceptional requirement. In such a case, the EDA tool typically will report the violation. For example, the tool may report that the path originating from the rise transition at the input node was found to be 1.5 ns, and report a violation. Because EDA tools conventionally do not report a motivation for a failure condition, e.g., default or exception conditions, a designer may incorrectly conclude that the reported violation (1.5 ns) met the timing requirement (default of 2.0 ns).

Embodiments of the present invention are able to identify to the user that an exception applied to the input node, improving a designer's ability to understand the results of EDA tools and to adjust and improve the design as necessary. In contrast, under the conventional art, a designer is faced with unpalatable alternatives—either conclude that the EDA tool's error report is a false positive, casting doubt on the efficacy of the tool, or manually pouring through potentially millions of exception statements to determine the cause of the failure.

There are two major types of optimizations that may be performed on an exception, or list of exceptions. One major type is context independent optimizations. These are optimizations that are, to a large extent, independent of a particular design. For example, if the design netlist or constraints are modified, the optimization of exceptions is not impacted, or impacted very little. Context independent optimizations generally operate on a list of exceptions without regard for, or independently of, the actual design.

For example, consider an exception specifying a particular path to be a multi-cycle path, e.g., the path is designed to operate in three clock cycles, rather than a default one clock cycle. Another exception may specify a subset or superset of that path to be an invalid path. In such a case, the exceptions may be optimized as an invalid path and the multi-cycle path exception may advantageously be eliminated from the list of exceptions. Eliminating such an exception from a list of exceptions reduces the operations performed by an EDA tool that uses a list of exceptions, and also reduces memory required to store and process such an exception. It is appreciated that this optimization made no reference to an actual design or context, rather only a list of exceptions. Consequently this exception is context independent. This type of optimization is known as a priority override.

An exception may specify a path with wildcard or set notation terms. For example:
    set_false_path-from {A B}-to F
The above expression establishes as a false path all paths from point A or point B to point F. It is equivalent to the combination of the following pair of exception expressions:
    set_false_path-from A-to F
    set_false_path-from B-to F
According to an embodiment of the present invention, exception statements may be expanded or "flattened" such that only one object exists per from-through-to specifier. This action advantageously allows a user to decompress exceptions entered or created in a compressed form. For example, the uncompressed form, after flattening, may aid a user in understanding a set of exceptions.

According to an embodiment of the present invention, a set or group of clock signals may be specified for use in a particular "run" of an EDA tool. As a beneficial result, clock signals of a design may be identified as unused. Conversely, a set of clock signals may be specified as unused by an EDA tool. Exceptions or exception terms referencing an unused clock may be advantageously ignored by an EDA tool. Consequently, an optimization process may eliminate such clock groups from a list of exceptions.

Embodiments of the present invention may perform optimization (possibly context sensitive) within a subset of design paths only without modifying any exceptions related to the rest of the design.

According to an embodiment of the present invention, a user is able to reset exceptions, in whole or in part by entering a reset expression into a list of exceptions. For example, an exception covering a large number, n, of paths may be established by the use of a wildcard statement. A capability to reset one path may be more attractive to a user than having to enter n−1 exception statements. Consequently, the reset exception is advantageously and automatically eliminated from a list of exceptions passed to an EDA tool.

Some EDA tools allow for an exception specifer to apply to the rise and/or fall transitions of signals through a path. For example, the exception statement "set_false_path-rise_through A" instructs an EDA tool to ignore rising transitions through point A. Elsewhere with a list of exceptions, an exception may be applied to the falling transition through point A, e.g., "set_false_path-fall through A." Since both rising and falling transitions through point A are to be ignored, these separate exceptions may be combined into a simpler expression "set_false_path-through A." According to an embodiment of the present invention, rise and fall exceptions to a common node may be optimized. Combining such a exceptions from a list of exceptions reduces the operations performed by an EDA tool that uses a list of exceptions, and also reduces memory required to store and process such a exceptions.

A second major type of optimization is context dependent optimizations. In contrast to context independent optimizations, these are optimizations that are, to a large extent, dependent on a particular circuit design and constraints. For example, if the design netlist is modified, the optimization of exceptions is generally impacted. Context dependent optimizations generally operate on a list of exceptions in association with an actual circuit design.

An exception may specify a signal path that is invalid in the current analysis mode. For example, a timing analysis tool could be set to analyze timing for a read mode of an IC design. This mode setting may invalidate large numbers of nets, e.g., those nets not associated with read operations. Consequently, exceptions applying to such invalidated nets may be beneficially ignored during operation in a particular mode. This optimization is known as a mode analysis optimization.

For example, consider an exception specifying a particular path to be a multi-cycle path, e.g., the path is designed to operate in three clock cycles, rather than a default one clock cycle. By examining the circuit design (netlist), it may be determined that the path does not exist. This superfluous exception may have been created by a number of conventional techniques. For example, it may have been created by an automated script including a "wildcard" statement, or it may be "left over" from a previous iteration of the circuit design. Even though the exception does not apply to the present circuit design, never-the-less it presents a computational and storage burden to an EDA tool.

In such a case, the multi-cycle exception may be eliminated, as the specified path does not exist in the actual circuit design. The multi-cycle path exception may advantageously be eliminated from the list of exceptions. Eliminating such an exception completely or partially from a list of exceptions reduces the operations performed by an EDA tool that uses a list of exceptions, and also reduces memory required to store and process such an exception. It is appreciated that this optimization made reference to an actual design or context. For example, if the circuit design were different or if the circuit was constrained differently, the path might exist and this particular instance of an optimization would not apply. This type of optimization is known as a no path optimization.

According to an embodiment of the present invention, exceptions or parts of exceptions, which identify a clock path may be optimized and eliminated. Timing analysis is performed relative to a clock that defines timing for the rest of the circuit. Consequently, measuring clock performance relative to itself is inherently undefined. Eliminating such an exception from a list of exceptions reduces the operations performed by an EDA tool that uses a list of exceptions, and also reduces memory required to store and process such an exception. This type of optimization is known as a clock path optimization.

According to another embodiment of the present invention, a circuit design may comprise paths for which synchronous timing constraints are not defined. Eliminating an exception covering non-constrained circuit paths from a list of exceptions reduces the operations performed by an EDA tool that uses a list of exceptions, and also reduces memory required to store and process such an exception. This type of optimization is known as an unconstrained path optimization.

According to still another embodiment, an exception may specify that a path should be analyzed with a multi-cycle path, and the setting of the multi-cycle countis equal to the default behavior of the analysis tool, e.g., one clock cycle. It is to be appreciated that such an exception specification is redundant. Eliminating such an exception from a list of exceptions reduces the operations performed by an EDA tool that uses a list of exceptions, and also reduces memory required to store and process such an exception. This type of optimization is known as a default multi-cycle path optimization.

According to yet another embodiment, an exception may specify a path with redundant terms. Referring again to FIG. 1, an exemplary exception may specify a false path from A 110 through u2/o 122 through u3/i1 134. From a reachability analysis, it may be determined that the only subpath from A 110 to u3/i1 is through u2/o 122. In this example, the term u2/0 is redundant, and may be removed without detrimental effect. Conversely, removing such a term from an exception or from a list of exceptions reduces the operations performed by an EDA tool that uses a list of exceptions, and also reduces the memory required to store and process such an exception. This type of optimization is known as a reduction by reachability analysis or redundancy optimization.

Figure 5:
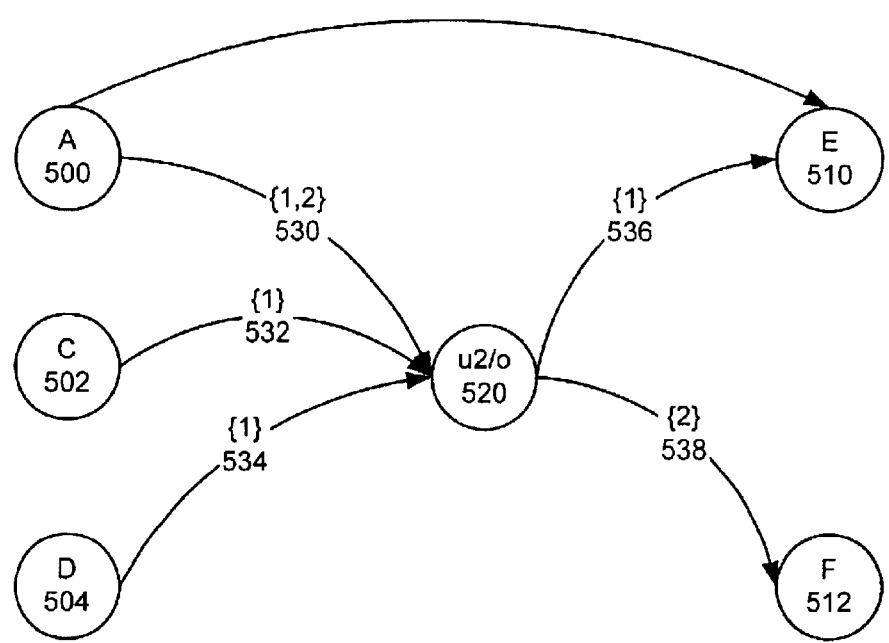
FIG. 5 illustrates an exception graph created according to embodiments of the invention.

Turning to FIG. 5, many context dependent optimizations may be made based upon a novel exception graph. The exception graph is acyclic in nature. A node in the exception graph represents a design pin (exception pin) which is specified in one or more user-entered exceptions, along with all pins that originate design paths leading to exception pins as well as all pins that terminate design paths traversing exceptions pins. An edge in the exception graph represents a physical, timing-enabled connection between adjacent exception pins. The edge holds data as to which user-entered exceptions traverse design subpaths between the adjacent exception pins.

The graph may be generated in two phases. First, the basic connectivity information is generated during a traversal of the design, e.g. breadth-first. The analysis that then populates the edge information can be performed by an explicit backwards traversal of the exception graph itself. That latter traversal can be depth-first, starting with the exceptions usage information collected after timing analysis at design endpoints.

Turning to FIG. 5 and assuming the layout 100 of FIG. 1, and the following two exceptions:

(1) set_false_path-through u2/o-to E
(2) set_multicycle_path 3-from A-to F

The exception graph shown in FIG. 5 is generated through the two phase exception graph generation process discussed above. The exception pins (A 500, C 502, D 504, E 510, F 512, and u2/0 520) are the nodes of the graph and the edges are populated with information about exceptions usage, e.g. {1} tracks the first exception, {2} the second, {1,2} both the first and second, etc.

This exception graph is then "aligned" with the graph of the circuit design. For example, identical nodes in the two graphs are associated. By comparing the structure, e.g., nodes and linkages of the exception graph with the structure of the design graph, context dependent optimizations may be identified. More specifically, to analyze the existence of a design path covered by an exception, the tool simply needs to verify the existence of a path from a source node in the exceptions graph to a target node that satisfies the exception specification. By way of definition, in the exception graph, a source node has no incoming edges and a target node has no outgoing edges.

In addition, constructing an exception graph may identify certain context independent optimizations. For example, as an exception graph is constructed, it may be observed that one exception statement overrides another. It is appreciate that this optimization, a priority override exception described above, can be identified without reference to the circuit design, e.g. prior to aligning the exception graph to the design graph.

It is to be appreciated that embodiments of the invention are well suited to other methods of identifying optimizations to a list of exceptions. For example, a no path exception optimization could be detected by tracing the paths specified by an exception through a netlist.

Another type of exception optimization relates to tool dependencies. Although exceptions and the SDC syntax are widely used, there are some incompatibilities in implementation. For example, not all tools support the "-through" syntax. Thus, such exceptions should be converted to an equivalent "-to" or "-from" structures for use by such tools. Embodiments of the invention can perform such transformations automatically.

The preferred embodiment of the present invention, system and method for optimizing exceptions, is thus described. While the present invention has been described in particular embodiments, it should be appreciated that the present invention should not be consrtrued as limited by such embodiments, but rather construed according to the following claims.

We claim:

1. A computer implemented method for generating an optimized list of exceptions for use by an electronic design automation (EDA) tool, the method comprising:
    accessing a first list of exceptions defining non-default timing constraints of a circuit design, wherein the first list of exceptions includes exceptions that are invalid, overridden, redundant, or non-optimal; and
    optimizing the first list of exception to generate a second list of exceptions, wherein the optimization process eliminates exceptions in the first list of exceptions that are invalid, overridden, redundant, or non-optimal and resolves conflicting information in the first list of exceptions, and wherein the second list of exceptions is optimized such that the EDA tool operates more efficiently on the circuit design using the second list of exceptions as compared to using the first list of exceptions.

2. The method of claim 1, wherein operating more efficiently comprises shorter run time for the EDA tool using the second list of exceptions compared to run time using the first list of exceptions.

3. The method of claim 1, wherein operating more efficiently comprises less memory usage for the EDA tool using the second list of exceptions compared to memory usage using the first list of exceptions.

4. The method of claim 1, further comprising performing one or more of a timing analysis and a static timing analysis on the circuit design using the EDA tool and the second list of exceptions.

5. The method of claim 1, further comprising performing synthesis on the circuit design using the EDA tool and the second list of exceptions.

6. The method of claim 1, further comprising performing a placement on the circuit design using the EDA tool and the second list of exceptions.

7. The method of claim 1, further comprising performing a routing on the circuit design using the EDA tool and the second list of exceptions.

8. The method of claim 1, further comprising performing one or more of a noise analysis and a static noise analysis on the circuit design using the EDA tool and the second list of exceptions.

9. The method of claim 1, further comprising performing a power analysis on the circuit design using the EDA tool and the second list of exceptions.

10. The method of claim 1, further comprising performing a reliability analysis on the circuit design using the EDA tool and the second list of exceptions.

11. The method of claim 10, wherein the reliability analysis comprises an electro-migration analysis.

12. The method of claim 1, further comprising generating a report analyzing contents of the second list of exceptions.

13. The method of claim 1, wherein the first list of exceptions generated by one or more of user input and a second EDA tool.

14. The method of claim 1, wherein the optimizing further comprises one or more of:

a non-existent path optimization; a clock path optimization; an unconstrained path optimization; a multi-cycle path optimization; a redundant exception optimization; a non-existent circuit optimization; a priority ordering optimization; and a flattening optimization.

15. The method of claim 1, wherein the optimizing further comprises one or more of:

an invalid path optimization; a merging rise and fall exceptions optimization; a wildcard and single reset optimization; and a tool-specific syntax optimization.

16. A method for context dependent exception list optimization for EDA tool usage, the method comprising:

generating an exception graph from an input design and an exception list, wherein the exception list includes exceptions that are invalid, overridden, redundant, or non-optimal, wherein the exception graph having a plurality of nodes coupled by a plurality of directed edges, and wherein the exception graph describing connectivity of the input wherein nodes in the plurality of nodes correspond to exception pins and edges in the plurality of edges correspond to exception usage along paths in the design;

determining the existence of a design path covered by an exception by verifying a path from a first node in the plurality of nodes to a second node in the plurality of nodes, wherein the first node comprises a source node and the second node comprises a target node;

optimizing the exception list responsive to the determining, wherein the optimization process eliminates exceptions in the non-optimized list of exceptions that are invalid, overridden, redundant, or non-optimal and resolves conflicting information in the non-optimized list of exceptions, end wherein the optimized list of exceptions is optimized such that the EDA tool operates more efficiently on the circuit design using the optimized list of exceptions as compared to using the non-optimized list of exceptions; and performing analysis of the input design using the exception list responsive to the optimizing.

17. The method of claim 16, wherein the optimizing further comprises removing exceptions from the exception list responsive to the determining.

18. The method of claim 16, wherein the optimizing further comprises marking exceptions in the exception list responsive to the determining such that the performing ignores marked exceptions.

* * * * *

UNITED STATES PATENT AND TRADEMARK OFFICE
CERTIFICATE OF CORRECTION

PATENT NO. : 6,964,027 B2  Page 1 of 1
DATED : November 8, 2005
INVENTOR(S) : Kayhan Kucukcakar et al.

It is certified that error appears in the above-identified patent and that said Letters Patent is hereby corrected as shown below:

<u>Column 12,</u>
Line 21, delete "end" and replace with -- and --.

Signed and Sealed this

Seventeenth Day of January, 2006

JON W. DUDAS
*Director of the United States Patent and Trademark Office*